United States Patent [19]

Blonder

[11] Patent Number: 4,810,557
[45] Date of Patent: Mar. 7, 1989

[54] METHOD OF MAKING AN ARTICLE COMPRISING A TANDEM GROOVE, AND ARTICLE PRODUCED BY THE METHOD

[75] Inventor: Greg E. Blonder, Summit, N.J.

[73] Assignee: American Telephone and Telegraph Company, AT&T Bell Laboratories, Murray Hill, N.J.

[21] Appl. No.: 163,685

[22] Filed: Mar. 3, 1988

[51] Int. Cl.$^4$ .................. H01L 21/306; B44C 1/22
[52] U.S. Cl. .................. 428/156; 156/647; 156/651; 156/654; 156/657; 156/661.1; 156/662; 350/96.15; 350/96.21
[58] Field of Search .............. 156/647, 648, 651, 654, 156/657, 659.1, 661.1, 662, 653; 357/55; 350/96.12, 96.15, 96.2, 96.22, 96.21; 428/156, 163, 167; 252/79.3, 79.4, 79.5

[56] References Cited

U.S. PATENT DOCUMENTS

| 3,506,509 | 11/1967 | Kragness et al. | 156/17 |
| 3,765,969 | 10/1973 | Kragness et al. | 156/17 |
| 3,864,018 | 2/1975 | Miller | 350/96 |

OTHER PUBLICATIONS

*The Bell System Technical Journal,* vol. 57, No. 1, Jan. 1978, "Fiber-Optic Array Splicing with Etched Silicon Chips" by C. M. Miller, pp. 75-90.
*The Bell System Technical Journal,* vol. 57, No. 1, Jan. 1978, "Accurate Silicon Spacer Chips for an Optical-Fiber Cable Connector" by C. M. Schroeder, pp. 91-97.
*Journal of Lightwave Technology,* vol. LT-5, No. 12, Dec. 1987, "Single-Mode Optical Fiber Connection to High-Silica Waveguide with Fiber Guiding Groove" by Y. Yamada et al., pp. 1716-1720.
*IEEE Transactions on Electron Devices,* vol. ED-25, No. 10, Oct. 1978, "Anisotropic Etching of Silicon" by K. E. Bean, pp. 1185-1193.
*Proceedings of the IEEE,* vol. 70, No. 5, May 1982, "Silicon as a Mechanical Material" by K. E. Peterson, pp. 420-457.

*Primary Examiner*—William A. Powell
*Attorney, Agent, or Firm*—Eugen E. Pacher

[57] ABSTRACT

Tandem grooves (or other groove-like features) with controlled transition between the narrow and wide portion of the groove can be formed in a (100) Si surface by a method that comprises patterning a first masking layer such that the resulting aperture in the masking layer defines the tandem groove, recovering the narrow part of the aperture with a second masking layer, subjecting the wide portion of the aperture to an initial etch, removing the second masking layer from the narrow part of the aperture, and subjecting the aperture to a further etch such that both the wide and the narrow portions of the tandem V-groove are completed. The inventive method is advantageously used to produce grooves that allow attachment of a coated optical fiber to a Si substrate.

5 Claims, 2 Drawing Sheets

METHOD OF MAKING AN ARTICLE COMPRISING A TANDEM GROOVE, AND ARTICLE PRODUCED BY THE METHOD

FIELD OF THE INVENTION

This application pertains to methods of making articles that comprise a semiconductor part with a groove therein, the groove adapted for receiving an optical fiber and maintaining the fiber in a predetermined position.

BACKGROUND OF THE INVENTION

In the field of optical fiber communications the need for maintaining the end of an optical fiber in fixed position relative to another optical fiber, a planar waveguide, an opto-electronic device, or some other part frequently arises. Typically the end of the optical fiber is to be maintained in optical coupling relationship with the other part.

A known way of maintaining the end of an optical fiber in a fixed predetermined position comprises providing a semiconductor substrate with a V-groove therein, placing the fiber into the V-groove, and maintaining the fiber in the groove by appropriate means. This approach is used, for instance, in an optical fiber connector disclosed in U.S. Pat. No. 3,864,018. See also C. M. Miller, *The Bell System Technical Journal*, Vol. 57(1), pp. 75–90 (January 1978), and C. M. Schroeder, ibid, pp. 91–97. A different approach for coupling an optical fiber to a channel waveguide is disclosed by Y. Yamada et al in *Journal of Lightwave Technology*, Vol. LT-5(12), pp. 1716–1720 (December 1987).

Semiconductor chips comprising accurately placed, shaped and dimensioned V-grooves can be readily produced by known photolithographic and etching techniques. See, for instance, U.S. Pat. Nos. 3,765,969 and 3,506,509, which disclose means for anisotropic etching of Si. See also K. E. Bean, *IEEE Transactions on Electron Devices*, Vol. ED-25(10), pp. 1185–1193 (October 1978), incorporated herein by reference, and K. E. Petersen, *Proceedings of the IEEE*, Vol. 70(5), pp. 420–457 (May 1982).

As is well known, optical fibers typically comprise one or more polymer coatings that protect and strengthen the fiber. Since the thickness of the coating typically is not controlled to the same degree that the thickness and concentricity of the fiber are controlled (as well as for other reasons), the coating is generally stripped from the end portion of the fiber before the fiber is coupled to another fiber or device. A bare fiber is, however, relatively fragile, and care must be taken to insure that the bare fiber end is maintained substantially free of mechanical stress. This problem is alleviated if the semiconductor substrate contains a tandem V-groove, i.e., a V-groove that can accommodate a short length of bare fiber together with a portion of the coated fiber. In such a tandem V-groove the coated fiber portion can be epoxied into (or otherwise affixed to) the large cross-section portion of the V-groove, thereby providing strain relief, whereas the bare portion of the fiber is affixed to the small cross-section portion of the V-groove in the usual manner.

The prior art method of making a tandem V-groove in (100) silicon comprises providing an appropriately patterned masking layer (e.g., $SiO_2$ or silicon nitride) that comprises a corner compensation feature of the type shown in FIG. 1. The method also comprises simultaneously etching both parts of the V-groove. See, for instance, K. E. Bean, op. cit. The corner compensation feature serves to limit undercutting in the transition region of the tandem V-groove, such that a relatively controlled transition between the large and small cross-section portions of the tandem groove results.

In FIG. 1 is schematically shown a portion of an article 1 comprising a tandem V-groove in (100) Si substrate 10 produced by the prior art method, wherein numerals 11 and 15 refer to the sloping side walls of the wide (14) and narrow (16) portions of the groove, respectively, 12 refers to the masked portion of the Si surface, and dotted lines 13 indicate the shape of the transition region between 14 and 16. Numerals 17 refer to the corner compensation feature of the masking layer.

The prior art technique has several shortcomings. For instance, the presence of the compensation feature restricts the flow of etchant which, in turn, may result in asymmetry of the groove. Furthermore, the small cross-section portion of the tandem groove is etched to completion long before etching of the remainder of the groove is completed. This may result in undercutting of the former, with attendant reduction of dimensional control. Still further, the "ears" (17) resulting from the compensation feature may be in the way of the fiber during placement of the fiber into the groove, since it may not always be practical to remove the ears by etching or other appropriate procedure. Finally, certain combinations of feature sizes may be completely unattainable by means of corner compensation.

In view of the advantages that a tandem V-groove can offer, a method of producing such a groove that is not subject to some or all of the shortcomings of the prior art method would be of interest. This application discloses such a method.

SUMMARY OF THE INVENTION

The inventive method comprises forming a first masking layer on a major surface of an appropriate semiconductor part and patterning the first masking layer such that an opening exposing the underlying semiconductor is formed therein. The opening defines the outline of the desired tandem groove (or other groove-like feature) and thus comprises a relatively wide portion and a relatively narrow portion, the former associated with the relatively large cross-section portion of the groove-like feature and the latter with the relatively narrow cross-section portion. The method further comprises forming a second masking layer that re-covers the narrow portion of the opening but leaves the wide portion thereof essentially uncovered. Typically this is done by forming a masking layer that covers all of the previously formed opening and removing the portion of the masking layer that covers the wide portion of the opening.

The first and the second masking layers are chosen such that the second masking layer can be removed without completely removing the first masking layer. For instance, the first could be a relatively thick (>1 $\mu$m) $SiO_2$ layer and the second relatively thin (<0.5 $\mu$m) $SiO_2$ layer, or they could be dissimilar materials (e.g., $SiO_2$ and silicon nitride, respectively). The method furthermore comprises contacting the semiconductor surface that is exposed in the wide portion of the opening with an appropriate anisotropic etchant, and terminating the initial etch before the wide portion of the groove is completely formed.

If the semiconductor is Si, the major surface advantageously is parallel to a (100) crystallographic plane, and the axis of the groove is oriented essentially parallel to a [110] crystallographic direction. An exemplary anisotropic etchant is KOH in water and normal propanol (see K. E. Bean, op. cit.). As is well known to those skilled in the art, this etchant (as well as other known etchants), has a very slow etch rate for Si (111) planes, and thus produces (in the above-specified geometry) a V-groove having (111) side walls.

After termination of the initial etch the second masking layer is removed from the narrow portion of the aperture such that the semiconductor material underlying the narrow portion of the opening is also exposed. Finally, the semiconductor underlying the opening in the first masking layer is contacted with the anisotropic etch and etching continued until both the large and the small cross-section portions of the tandem V-groove are fully formed.

The inventive method makes it possible to produce tandem grooves without the use of non-planar lithography, e.g., using conventional single layer or tri-level resists. As will be appreciated by those skilled in the art, this is a significant advantage.

Etching times typically are not critical and are generally easily determined. For instance, if both the large and small cross-section portions of the tandem groove are to be etched to attain full V-shape, then the partial etch appropriately is terminated when the width of the bottom of the groove is approximately equal to the width of the narrow portion of the opening in the masking layer.

The inventive method has relatively broad applicability and can in principle be used to form tandem grooves of a variety of cross-sectional shapes in a variety of semiconductors (typically having cubic crystal structure). The currently preferred semiconductor material is Si, and the currently preferred cross-section shape of the groove-like feature formed by means of the inventive method is V-like (including an incomplete V, i.e., a groove with sloping walls but flat bottom). Furthermore, the inventive method is not limited to making simple tandem grooves but can be used to make more complicated features that comprise one or more portions that require a longer etching time than another portion of the feature. For instance, the feature can be a groove for locating two opposed optical fibers in coupling relationship, with the feature comprising a central portion having a relatively small cross section and two end portions, each having a relatively large cross section. Furthermore, the inventive method can, with obvious modifications, be used to produce unconnected anisotropically etched features in a semiconductor surface, with one or more of the features requiring a longer etching time than the remainder.

Exemplarily, the inventive method is used in making an "optical bench" chip of the type disclosed, for instance, in a concurrently filed U.S. patent application (G. E. Blonder 13, "Subassembly for Opto-Electronic Hybrid Integrated Circuits").

DETAILED DESCRIPTION OF SOME PREFERRED EMBODIMENTS

Figure 2:
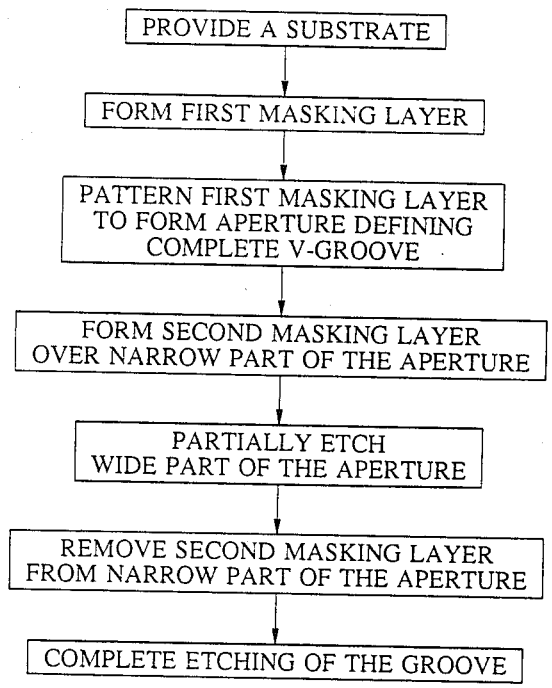
FIG. 2 shows in block diagram form major steps of an exemplary embodiment of the inventive method.

FIG. 2 outlines important processing steps in an exemplary embodiment of the invention. The steps comprise formation of the first masking layer on a major surface of a semiconductor body, patterning of the first masking layer to form an aperture therein that defines the groove-like feature that is to be formed in the surface, forming a second masking layer over the narrow part of the aperture (typically by depositing and patterning the second masking layer), partially etching the wide part of the aperture, removing the second masking layer from the narrow part of the aperture, and completing etching. It will be understood that the inventive method typically also comprises one or more steps such as placing an optical fiber into the groove and securing it therein, attaching one or more opto-electronic components (radiation sources and/or detectors) to the Si substrate, possibly forming a planar waveguide in or on the substrate, providing means for making electrical contact with the component(s), and encapsulating the package. These (and possibly other) steps may be conventional and do not require detailed description.

Figure 3:
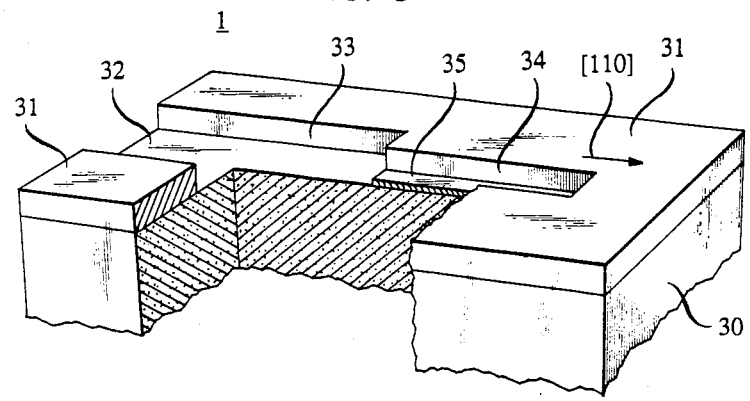
FIGS. 3-5 schematically show an article according to the invention at various stages of manufacture.
Figure 4:
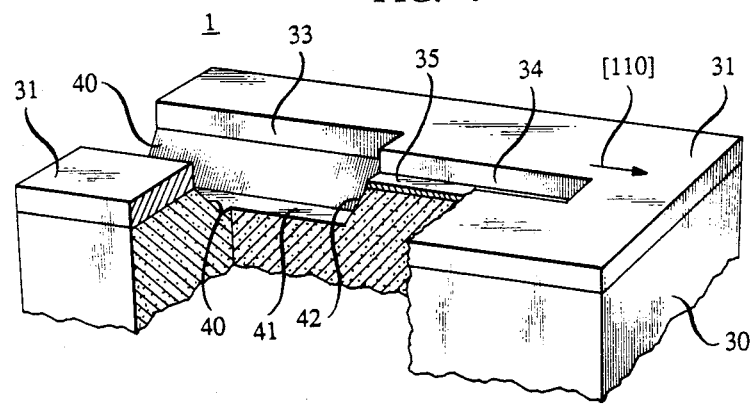
Figure 5:
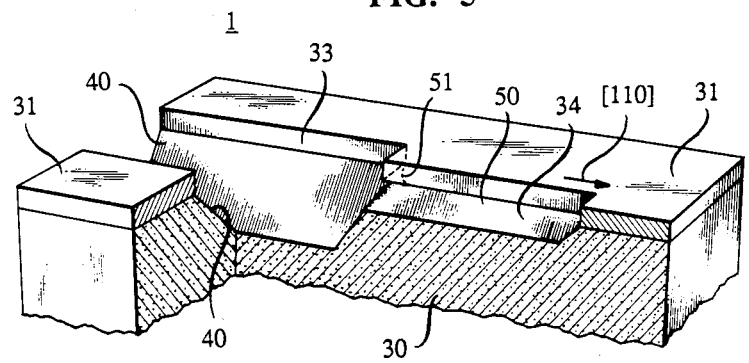

FIGS. 3-5 schematically show the relevant portion of an exemplary article according to the invention at various stages of manufacture. As shown in FIG. 3, the article comprises a semiconductor body 30, typically a Si chip having a (001) major surface that is at least partially covered by an appropriate first masking layer 31, e.g., a relatively thick $SiO_2$ layer grown by a conventional technique. A relatively thick first masking layer may have several advantages. As already indicated, it permits removal of the second masking layer from the narrow portion of the aperture without exposing other portions of the semiconductor surface. Furthermore, a relatively thick first masking layer may have advantageous dielectric properties (e.g., high dielectric strength), result in a low capacitance structure, or be able to carry an imbedded waveguide.

The first masking layer is patterned by an appropriate conventional technique (e.g., lithography and plasma etching) such that an aperture 32 is formed therein, the aperture baring a portion of the Si surface having the shape of the groove-like feature to be formed in the surface. The aperture comprises a relatively wide portion 33 and a relatively narrow portion 34. The longitudinal axis of the aperture advantageously is oriented in a [110] crystallographic direction. The narrow portion of the aperture is then re-covered with an appropriate second masking layer 35, e.g., a relatively thin $SiO_2$ layer. This can, for instance, be accomplished by deposition of the masking layer, remasking, and removal of the oxide from 33.

After formation of the protective layer on 34 the substrate is contacted with an appropriate anisotropic etching medium, e.g., KOH in propanol and water. The etchant attacks (111)-type planes at a very slow rate. As depicted in FIG. 4, this results in formation of a groove having (111)-type side and end walls (40) and (42), respectively, together with (001) bottom (41). Etching is terminated before the final cross section of the wide portion of the groove is attained. Consequently, at this stage of the process the groove will always have a flat bottom. The appropriate etch time is easily determined by a minor amount of experimentation. Exemplarily etching is stopped when the width of 41 is approximately the same as that of 34.

The initial etching step is followed by removal of the second masking layer 35 from the narrow portion of the feature, e.g., by conventional plasma etching. Anisotropic etching is then resumed and carried to completion. Exemplarily this implies formation of a complete V-groove as shown in FIG. 5, wherein 50 refers to the sloping (111) side wall of the narrow portion of the tandem groove. However, etching need not necessarily be carried this far, and in some cases it may be desired to produce a groove-like feature in which one or more portions have a V-like cross section with a flat bottom. All of the possible cross-sectional shapes are intended to be encompassed by the term "V-groove".

As indicated schematically in FIG. 5 by means of broken line 51, a tandem groove produced according to the invention may exhibit a minor amount of undercutting in the transition region between the two portions of the groove, since most known applicable anisotropic etchants tend to attack convex corners defined by (111)-type planes. In many instances the presence of a minor amount of undercutting may actually be advantageous since it facilitates longitudinal insertion of a fiber into the groove.

Although the above-described embodiment of the invention is currently preferred there are other embodiments that may also be used advantageously. For instance, the first masking layer can be of intermediate thickness (e.g., 500 nm) chosen such that it is possible to remove the second masking layer 35 while still retaining a sufficiently thick first masking layer for the final etching step. Subsequent to the completion of the final etching step the masking layer can be removed and a protective layer of the desired thickness (e.g., 10 $\mu$m $SiO_2$) can be formed on the major surface, including the groove therein, to, for instance, attain a low capacitance structure. This embodiment of the inventive method typically minimizes undercutting in the transition region, but may result in stresses in the groove due to a difference in the thermal expansion coefficients of Si and of the protective $SiO_2$ layer thereon.

Figure 1:
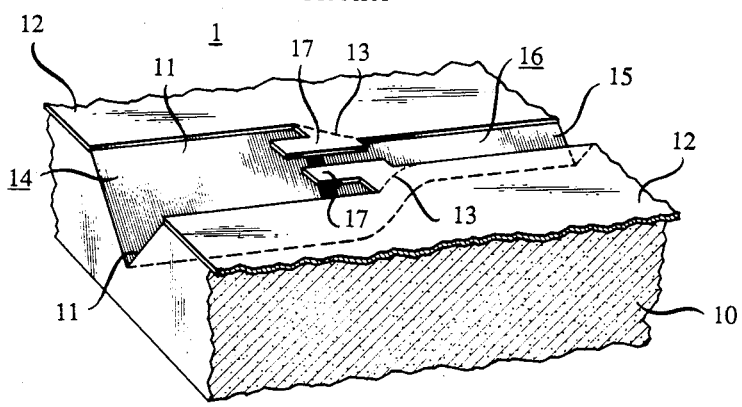
FIG. 1 schematically depicts a prior art tandem groove.

In a further exemplary embodiment of the invention, the first masking layer is again relatively thick (e.g., 10 $\mu$m $SiO_2$). The second masking layer comprises corner compensation features such as are shown in FIG. 1 and is relatively thin (e.g., 100 nm $SiO_2$). The resulting "ears" can be easily removed by conventional etching. This embodiment of the inventive method typically results in further reduction of undercutting and does not produce stress build-up in the groove.

EXAMPLE

A conventional (001) Si wafer was oxidized by a conventional higher pressure steam process to form a uniform $SiO_2$ layer (thickness about 10 $\mu$m) thereon. The $SiO_2$ surface was then covered with a conventional photoresist, the photoresist exposed through a mask, the exposed resist developed/patterned, and the wafer plasma etched to form apertures through the $SiO_2$ to the underlying Si, all in conventional manner. The mask contained multiple replicas of a basic pattern that corresponds to an optical bench chip. The basic pattern contains a double rectangle feature having a 400 $\mu$m $\times$ 2 mm portion and a 200 $\mu$m $\times$ 1 mm portion, resulting in apertures substantially as depicted in FIG. 3. The wafer was then re-oxidized by exposure to dry oxygen to form a 100 nm $SiO_2$ layer thereon, coated with conventional tri-level photoresist, exposed through a second mask, patterned, and the thin $SiO_2$ layer removed from the wide portion of the aperture by plasma etching, all in conventional manner. Next the wafer was etched in EDP (ethylenediamine pyrocatechol) until the wide portion of the V-groove was approximately ¾ finished (approximately 6 hours). The wafer was then dipped in BOE (7:1 HF to $NH_3F$) for about 90 seconds to remove 100 nm of $SiO_2$, thereby baring the narrow portion of the apertures. Finally, the wafer was re-etched in EDP until etching of the narrow portion of the V-groove was complete. At approximately the same time etching of the wide portion was complete, resulting in a wafer with tandem V-grooves thereon. After further processing the wafer was sliced, resulting in a multiplicity of "optical bench" chips to which opto-electronic components as well as an optical fiber can be attached during further processing.

What is claimed is:

1. A method of making an article comprising a semiconductor body having a major surface with at least one groove-like longitudinal feature therein, the feature comprising a first and a second part having a relatively large and a relatively small cross section, respectively, the method comprising
    (a) forming a first masking layer on the major surface, and patterning the first masking layer such that an opening is formed therein, the opening comprising a wide and a narrow portion associated with the first and the second part of the groove-like feature, respectively;
    (b) contacting the major surface region that is exposed in the opening in the first masking layer with an anisotropic etchant such that the groove-like feature is formed;
    characterized in that the method further comprises
    (c) covering, subsequent to (a) and prior to (b), the narrow portion of the opening with a second masking layer while leaving essentially uncovered the wide portion of the opening; contacting the major surface region that is exposed in the wide portion of the opening with the anisotropic etchant and terminating the contact before formation of the first part of the groove-like feature is completed; and removing the second masking layer from the narrow portion of the opening.

2. Method of claim 1, wherein the semiconductor body is a Si body, wherein the major surface is substantially parallel to a (001) crystallographic plane, and wherein the longitudinal axis of the groove-like feature is substantially parallel to a [110] crystallographic direction.

3. Method of claim 2, wherein the groove-like feature is a tandem V-groove adapted for receiving therein an end portion of an optical fiber.

4. Method of claim 2, wherein the groove-like feature further comprises a third part, the third part also having a relatively large cross section, the second part connecting the first and third parts, the groove-like feature being a tandem V-groove adapted for receiving therein in opposed position an end portion of each of two optical fibers such that the two optical fibers are optically coupled.

5. An article comprising a semiconductor body produced according to the method of claim 2.

* * * * *